United States Patent
Xu

(10) Patent No.: US 10,784,330 B2
(45) Date of Patent: Sep. 22, 2020

(54) ORGANIC THIN FILM TRANSISTOR ARRAY SUBSTRATE IN WHICH DATA LINE, SOURCE, DRAIN AND PIXEL ELECTRODE ARE FORMED BY ONE PHOTO MASK, MANUFACTURE METHOD THEREOF, AND DISPLAY DEVICE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Hongyuan Xu, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 406 days.

(21) Appl. No.: 15/740,968

(22) PCT Filed: Dec. 20, 2017

(86) PCT No.: PCT/CN2017/117320
§ 371 (c)(1),
(2) Date: Dec. 29, 2017

(87) PCT Pub. No.: WO2019/090911
PCT Pub. Date: May 16, 2019

(65) Prior Publication Data
US 2020/0035774 A1    Jan. 30, 2020

(30) Foreign Application Priority Data

Nov. 7, 2017  (CN) .......................... 2017 1 1097717

(51) Int. Cl.
*H01L 29/08* (2006.01)
*H01L 27/32* (2006.01)
(Continued)

(52) U.S. Cl.
CPC ...... *H01L 27/3274* (2013.01); *H01L 27/3248* (2013.01); *H01L 27/3262* (2013.01);
(Continued)

(58) Field of Classification Search
CPC .................. H01L 27/3274; H01L 27/3248
(Continued)

(56) References Cited

U.S. PATENT DOCUMENTS

2004/0105041 A1* 6/2004 Tsujimura ......... G02F 1/136209
                                                    349/42
2009/0278120 A1* 11/2009 Lee .................... H01L 29/7869
                                                    257/43
(Continued)

FOREIGN PATENT DOCUMENTS

CN            207199625 U        4/2018

*Primary Examiner* — Caleb E Henry
(74) *Attorney, Agent, or Firm* — Hemisphere Law, PLLC; Zhigang Ma

(57) ABSTRACT

An organic thin film transistor array substrate and manufacture method thereof, display device are provided. The method of manufacturing organic thin film transistor array substrate, comprising: providing substrate; depositing first metal layer, transparent electrode layer and photoresist layer on substrate by sequentially; using first half transparent photo mask for patterning treatment, and forming data line, source, drain and pixel electrode, wherein channel region is forming between source and drain; depositing semiconducting layer, insulating layer and second metal layer by sequentially; using second photo mask for patterning treatment, and forming active layer, grid insulating layer, grid on channel region, grid is connecting to scan line; depositing passiva-
(Continued)

tion layer; using third photo mask for patterning treatment and exposing pixel electrode; forming OLED material on pixel electrode. According to the method above could effectively reduce photo mask process and reduce cost.

13 Claims, 10 Drawing Sheets

(51) Int. Cl.
    *H01L 51/05* (2006.01)
    *H01L 51/10* (2006.01)
(52) U.S. Cl.
    CPC ...... *H01L 51/0541* (2013.01); *H01L 51/0558* (2013.01); *H01L 51/105* (2013.01); *H01L 2227/323* (2013.01)
(58) Field of Classification Search
    USPC .......................................................... 257/40
    See application file for complete search history.

(56) References Cited

U.S. PATENT DOCUMENTS

2014/0070181 A1   3/2014   Zhang
2017/0025493 A1   1/2017   Xu

* cited by examiner

ORGANIC THIN FILM TRANSISTOR ARRAY SUBSTRATE IN WHICH DATA LINE, SOURCE, DRAIN AND PIXEL ELECTRODE ARE FORMED BY ONE PHOTO MASK, MANUFACTURE METHOD THEREOF, AND DISPLAY DEVICE

RELATED APPLICATIONS

The present application is a National Phase of International Application Number PCT/CN2017/117320, filed Dec. 20, 2017, and claims the priority of China Application No. 201711097717.2, filed Nov. 7, 2017.

FIELD OF THE DISCLOSURE

The disclosure relates to a display technical field, and more particularly to an organic thin film transistor array substrate and manufacture method thereof, a display device.

BACKGROUND

The Organic Thin Film Transistor (OTFT) is a thin film transistor which using the organic material to be semiconductor material, usually is plastic substrate. The method of manufacturing organic thin film transistor is simpler than the method of manufacturing traditional in organic thin film transistor, the conditions of film-forming atmosphere and requirement of purity is less, and the cost is also lower. In addition, the organic thin film transistor has excellent flexible ability which suitable use to flexible display, electrically skin, flexible sensor field. The organic thin film transistor has advantageous such as curable, low manufacture cost. It has the most potential of new organic thin film transistor techniques for the next generation of flexible displays at the present time.

Currently, usually needs 6-7 photo mask process to finish the manufacture of organic thin film transistor substrate.

In the long-term research process, the inventor of this present invention finds the photolithography process will increase cost and reduce profit of manufacture. In addition, the currently material of organic thin film transistor usually using low work function metal silver for decreasing contact resistance, but the metal silver is easily oxidation without covering protect layer and decreasing conduction ability.

SUMMARY

A technical problem to be solved by the disclosure is to provide an organic thin film transistor array substrate and manufacture method thereof, a display device, it could solve the problem of too much photo mask process of existing technology causes high manufacture cost in existing technology.

An objective of the disclosure is achieved by following embodiments. In particular, a method of manufacturing organic thin film transistor array substrate, comprising:

providing a substrate;

depositing a first metal layer, a transparent electrode layer and a photoresist layer on the substrate by sequentially;

using a first half transparent photo mask for patterning treatment, and forming a data line, a source, a drain and a pixel electrode, wherein a channel region is forming between the source and the drain;

depositing a semiconducting layer, an insulating layer and a second metal layer by sequentially;

using a second photo mask for patterning treatment, and forming an active layer, a grid insulating layer, a grid on the channel region, the grid is connecting to a scan line;

depositing a passivation layer;

using a third photo mask for patterning treatment and exposing the pixel electrode.

According to another aspect of the disclosure, the disclosure further provides an organic thin film transistor array substrate, comprising a substrate;

a data line, a source, a drain and a pixel electrode formed by a first metal layer and a transparent electrode layer on the substrate, wherein a channel region is formed between the source and the drain;

an active layer, a grid insulating layer, a grid on the channel region and extending to form a scan line;

a passivation layer covering on the substrate and exposing the pixel electrode.

According to yet another aspect of the disclosure, the disclosure further provides a display device, comprising an organic thin film transistor array substrate, the organic thin film transistor array substrate is described above.

In sum, comparing the existing technology, the present invention provides a method of manufacturing organic thin film transistor array substrate, using a first half transparent photo mask to patterning treatment such that forming a data line, a scan line, a source and a drain in the same photo mask process. It effectively reduce photo mask process steps and reduce manufacturing cost; and after the photo mask process, transparent electrode layer covered on the first metal layer which could avoid oxidation of the first metal layer for the following process and cause transduction property of resistance.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

The disclosure will be further described in detail with reference to accompanying drawings and preferred embodiments as follows.

In the following, method of manufacturing organic thin film transistor array substrate 100 associated with the disclosure will be described with reference to FIG. 1 through FIG. 15. The method comprising the following steps.

Step S101, providing a substrate 10.

In this embodiment, the substrate 10 could be a flexible substrate, but here is not limited thereto.

Figure 1:
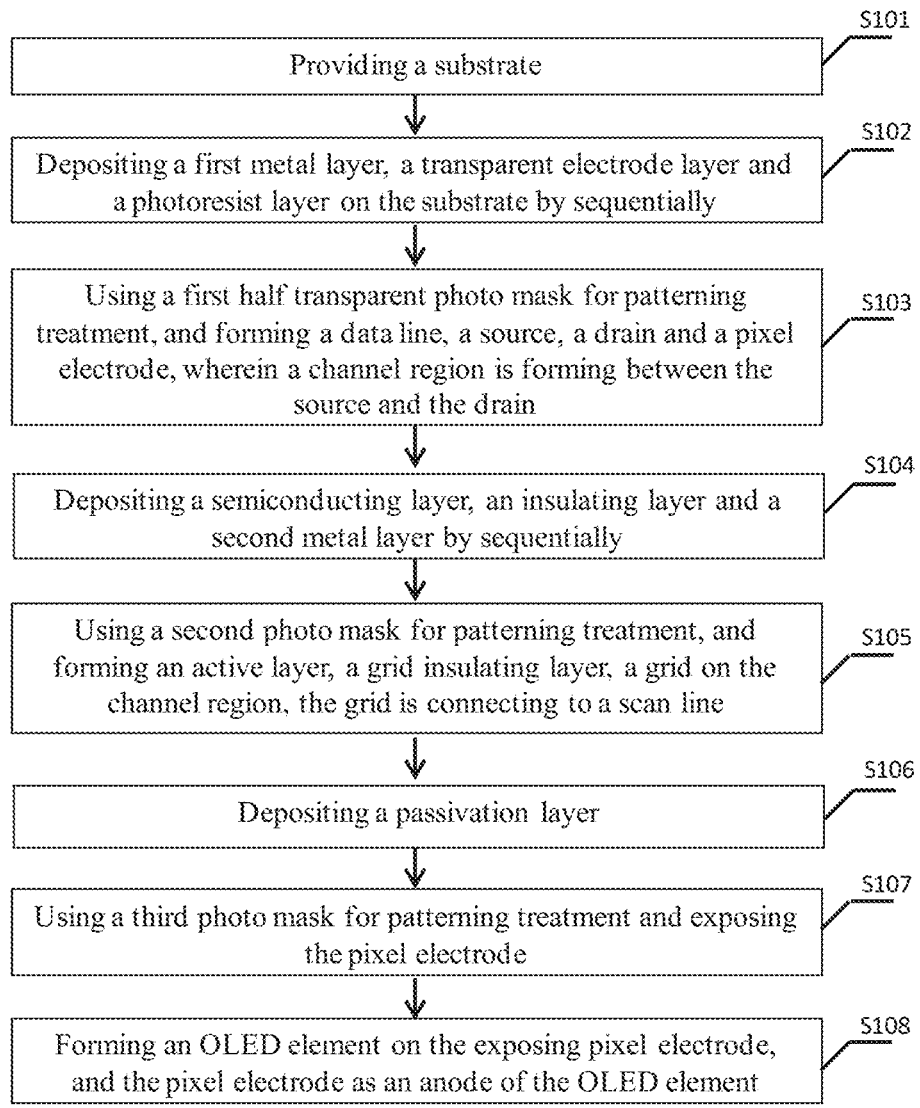
FIG. 1 is a flow chat schematic diagram of a method of manufacturing organic thin film transistor array substrate according to an embodiment of the disclosure.
Figure 2:
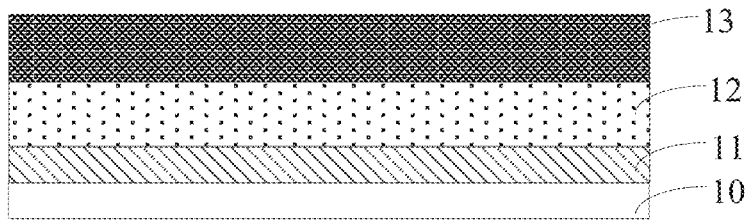
FIG. 2 is a structural schematic diagram of step S102 of the method of manufacturing organic thin film transistor array substrate according to an embodiment of the disclosure.
Figure 3:
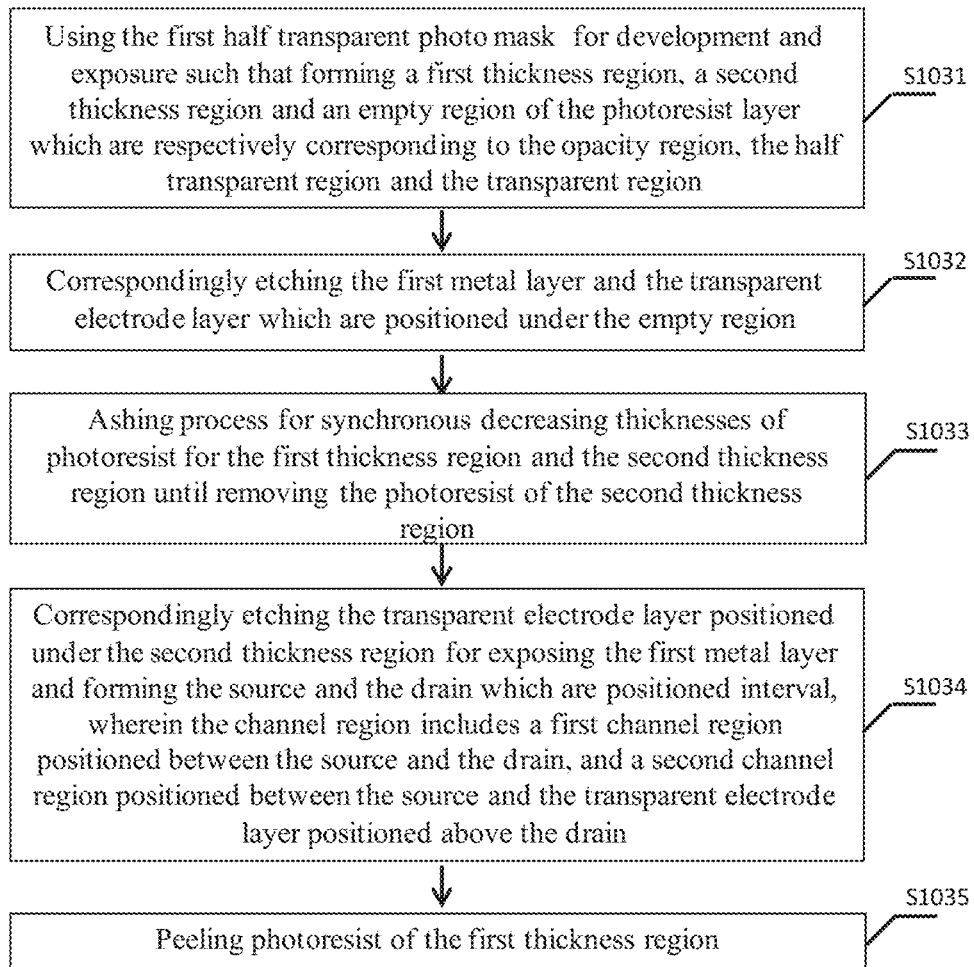
FIG. 3 is a flow chat schematic diagram of step sub-step of S103 of the method of manufacturing organic thin film transistor array substrate according to an embodiment of the disclosure.
Figure 4:
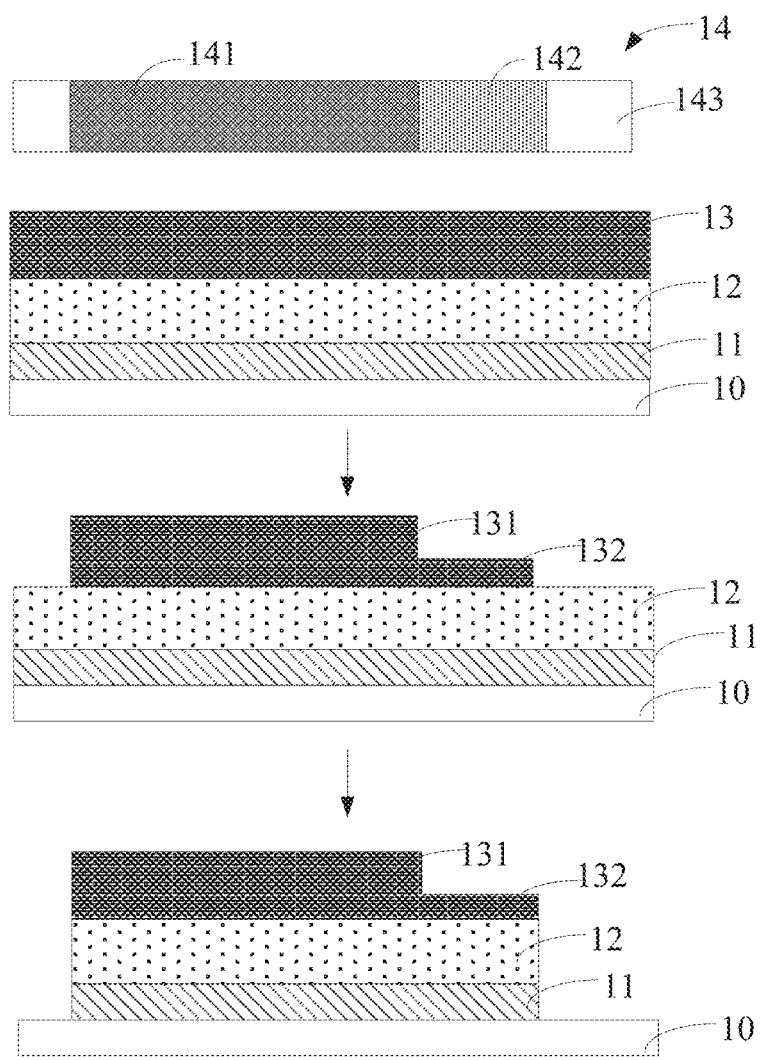
FIG. 4 is a structural flow chat schematic diagram of first part of step S103 of the method of manufacturing organic thin film transistor array substrate according to an embodiment of the disclosure.
Figure 5:
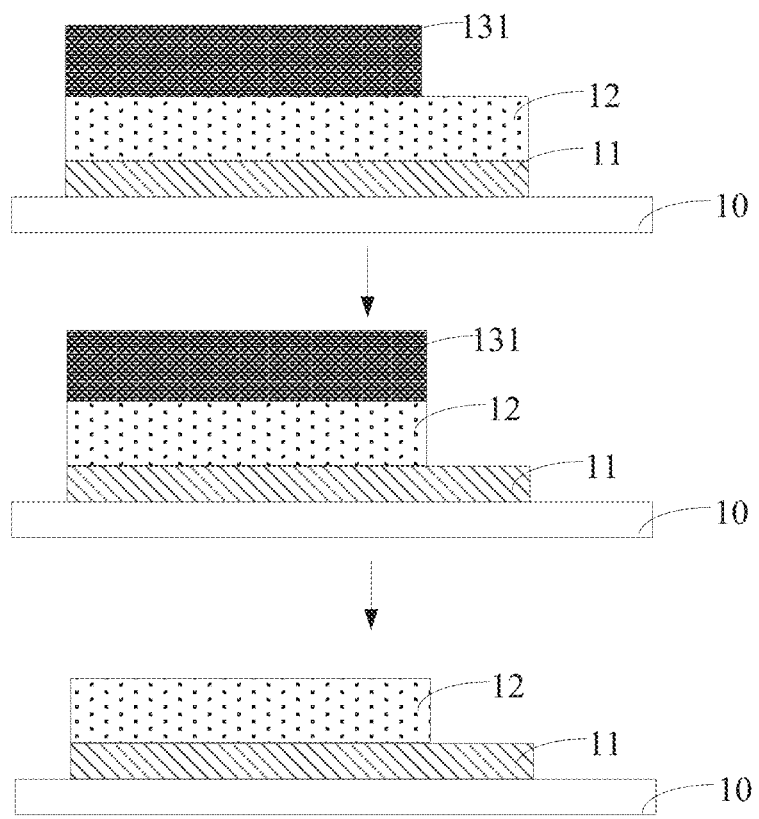
FIG. 5 is a structural flow chat schematic diagram of second part of step S103 of the method of manufacturing organic thin film transistor array substrate according to an embodiment of the disclosure.
Figure 6:
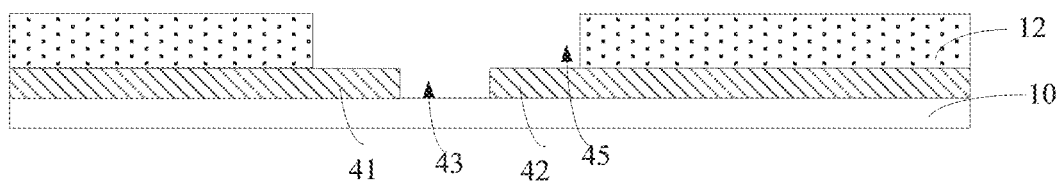
FIG. 6 is a structural schematic diagram of after sub-step S1034 of step S103 of the method of manufacturing organic thin film transistor array substrate according to an embodiment of the disclosure.
Figure 7:
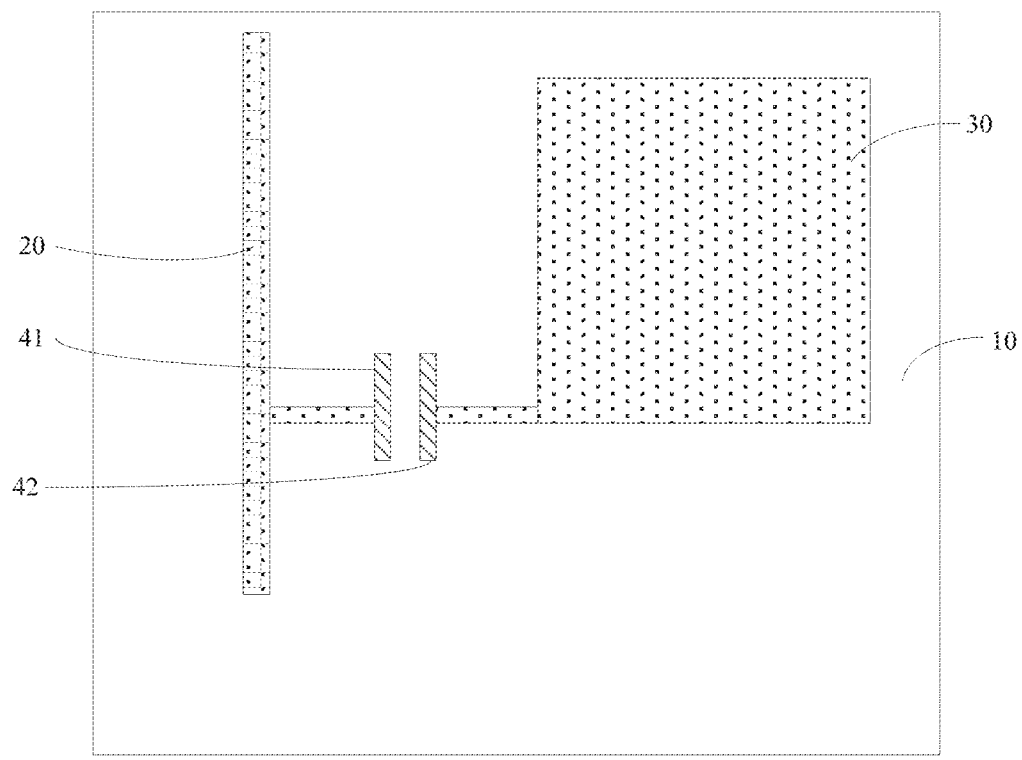
FIG. 7 is a top schematic diagram of the method of manufacturing organic thin film transistor array substrate after finishing step S103 according to an embodiment of the disclosure.

Step S102, please refer to FIG. 2. Depositing a first metal layer 11, a transparent electrode layer 12 and a photoresist layer 13 on the substrate 10 by sequentially.

In this embodiment, the first metal layer 11 is silver metal layer, the transparent electrode layer 12 is ITO layer.

Step S103, please refer FIG. 3 to FIG. 7. Using a first half transparent photo mask 14 for patterning treatment, and forming a data line 20, a source 41, a drain 42 and a pixel electrode 30, wherein a channel region is forming between the source 41 and the drain 42.

Wherein, in the step of "using the first half transparent photo mask 14 for patterning treatment", which the first transparent photo mask 14 includes a opacity region 141, a half transparent region 142, a transparent region 143, and the patterning treatment comprising:

Sub-step S1031, using the first half transparent photo mask 14 for development and exposure such that forming a first thickness region 131, a second thickness region 132 and an empty region of the photoresist layer 13 which are respectively corresponding to the opacity region 141, the half transparent region 142 and the transparent region 143;

Sub-step S1032, correspondingly etching the first metal layer 11 and the transparent electrode layer 12 which are positioned under the empty region;

Sub-step S1033, ashing process for synchronous decreasing thicknesses of photoresist for the first thickness region 131 and the second thickness region 132 until removing the photoresist of the second thickness region 132;

Sub-step S1034, please refer to FIG. 5 again. Correspondingly etching the transparent electrode layer 12 positioned under the second thickness region 132 for exposing the first metal layer 11 and forming the source 41 and the drain 42 which are positioned interval, wherein the channel region includes a first channel region 43 positioned between the source 41 and the drain 42, and a second channel region 45 positioned between the source 41 and the transparent electrode layer 12 positioned above the drain 42;

Sub-step S1035, peeling photoresist of the first thickness region 131.

In this embodiment, etching the first metal 11 and the transparent electrode layer 12 correspondingly positioned under the empty region which is respectively by ITO etching fluid and silver acid; etching the transparent electrode layer 12 positioned under the second thickness region 132 by ITO etching fluid.

It is noted that, in the step of "using the first half transparent photo mask 14 for patterning treatment", expect the source 41 and the drain 42, the data line 20 and the pixel electrode 30 is double-layer structure, which is a silver metal layer and ITO layer positioned by sequentially. Further, covering a protecting layer of the ITO layer on the data line 20 formed by silver metal later, and a substrate layer of the silver metal layer is formed between the pixel electrode 30 and the substrate 10 made by ITO layer. It could effectively reduce the impedance.

It is could be noted that, covering ITO layer on surface of silver metal layer could effectively avoid oxidation process of the silver metal layer for following process, and effect transduction property of the resistance.

Figure 8:
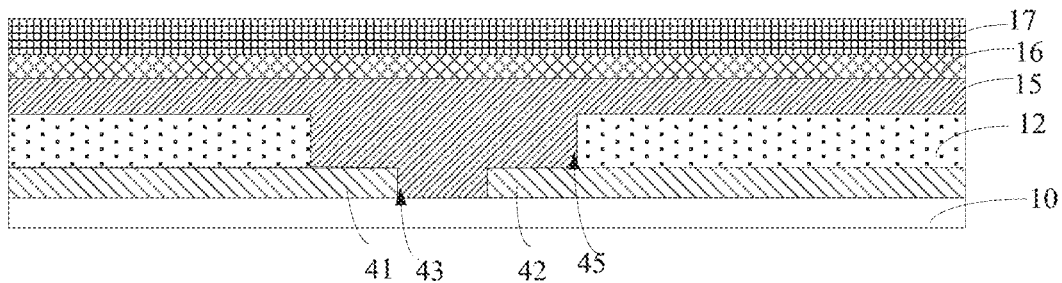
FIG. 8 is a structural schematic diagram of step S104 of the method of manufacturing organic thin film transistor array substrate according to an embodiment of the disclosure.

Step S104, please refer to FIG. 8. Depositing a semiconducting layer 15, an insulating layer 16 and a second metal layer 17 by sequentially.

In this embodiment, the second metal layer 17 is silver metal layer or copper metal layer.

Figure 9:
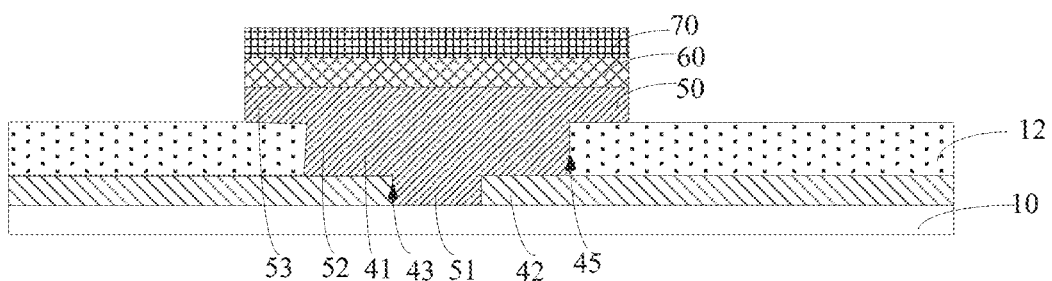
FIG. 9 is a structural schematic diagram of step S105 of the method of manufacturing organic thin film transistor array substrate according to an embodiment of the disclosure.
Figure 10:
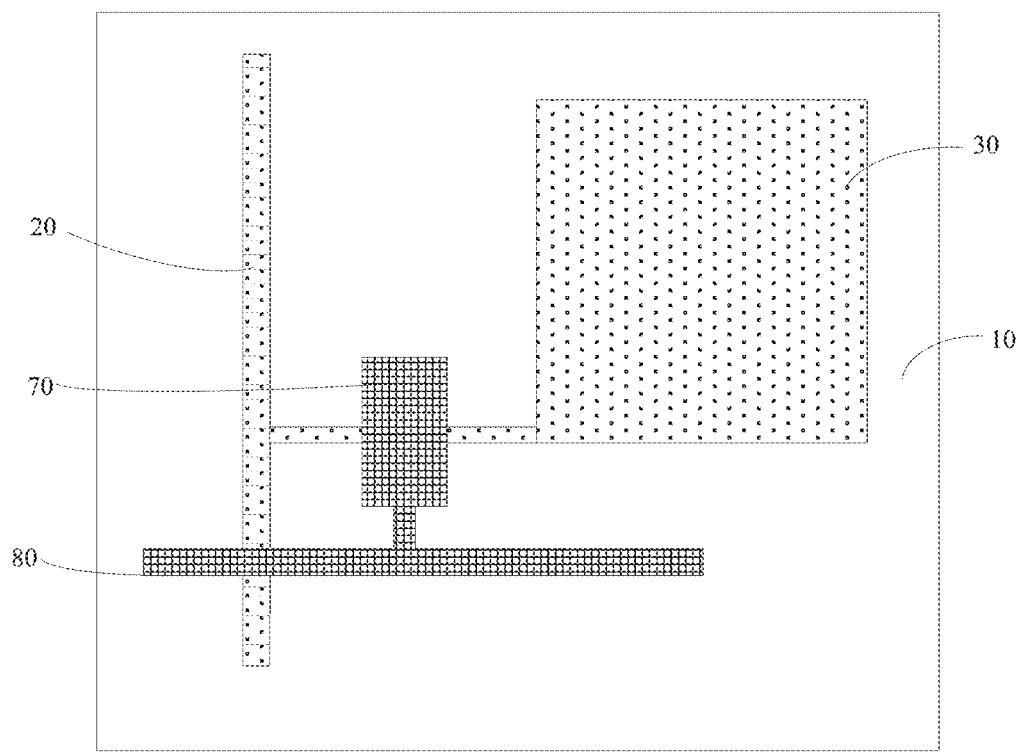
FIG. 10 is a top schematic diagram of the method of manufacturing organic thin film transistor array substrate after finishing step S105 according to an embodiment of the disclosure.

Step S105, please refer to FIG. 9 and FIG. 10. Using a second photo mask for patterning treatment, and forming an active layer 50, a grid insulating layer 60, a grid 70, and extending to form a scan line 80.

In the step of "using the second photo mask for patterning treatment", which the second photo mask includes a transparent region and an opacity region, the opacity region is corresponding to the channel region. The active layer 50 includes a first active layer 51 filled in the first channel region 43 and a second active layer 52 filled in the second channel region 45, and a third active layer 53 covering on edge of the transparent electrode layer 12.

It could be noted that, the source 50, the grid insulating layer 60, the grid 70 and the scan line 80 are using the second photo mask for patterning process at once. Wherein the grid 70 and the scan line 80 are integrated.

In this embodiment, the channel region formed the source 50, the grid insulating layer 60, the grid 70 and extending to form the scan line 80, which is the active layer 50 filled into the channel region, and extending to a region which correspondingly positioned scan line 80 on the substrate 10. The grid 70 and the scan line 80 are covering on the active layer 50 and positioned between the active layer 50 and the grid 70, the scan line 80.

In this embodiment, the second metal layer 17 is silver metal layer or copper metal layer.

It could be understand that, deposition of the semiconducting layer 15 and the insulating layer 16 could be dip coating method, spin coating method, blade coating method, contacting coating method, but it is not limited thereto.

In this embodiment, sequentially forming the source 50, the grid insulating layer 60, the grid 70 and the scan line 80 according to deposit the semiconducting layer 15, the insulating layer 16 and the second metal layer 17, and patterning treatment by the second photo mask which could effectively reduce mask numbers and reduce process of mask such that reduce the cost. In addition, the semiconducting layer 15 is covered by the insulating layer 16 and the second metal layer 17 during patterning process, it could effectively avoid the semiconducting layer 15 contacts to chemical agent (for example developing solution, stripping solution, photoresist) during the patterning process so that cause damage.

Figure 11:
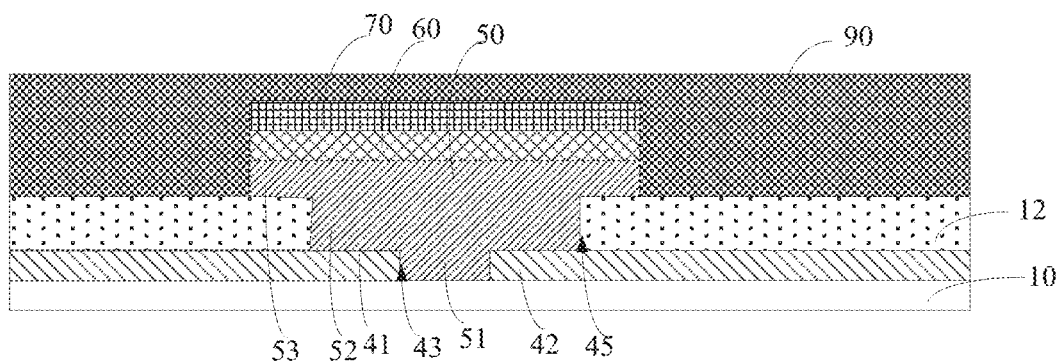
FIG. 11 is a structural schematic diagram of step S106 of the method of manufacturing organic thin film transistor array substrate according to an embodiment of the disclosure.

Step S106, please refer to FIG. 11, Depositing a passivation layer 90.

In this embodiment, the passivation layer 90 is made by insulating materials.

Figure 12:
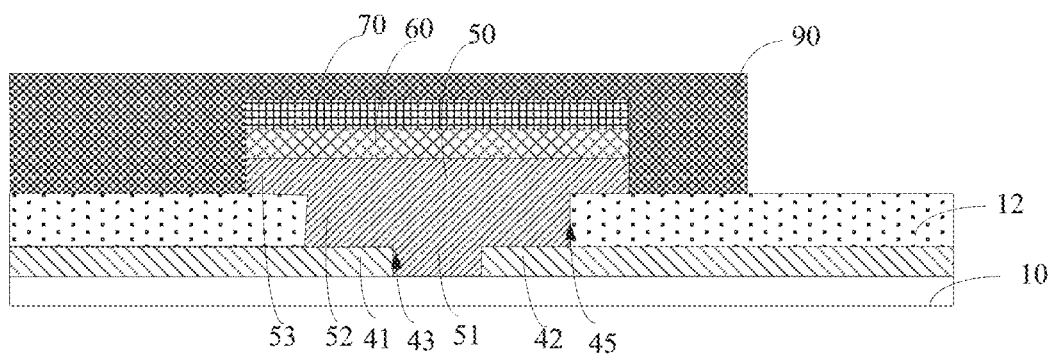
FIG. 12 is a structural schematic diagram of step S107 of the method of manufacturing organic thin film transistor array substrate according to an embodiment of the disclosure.
Figure 13:
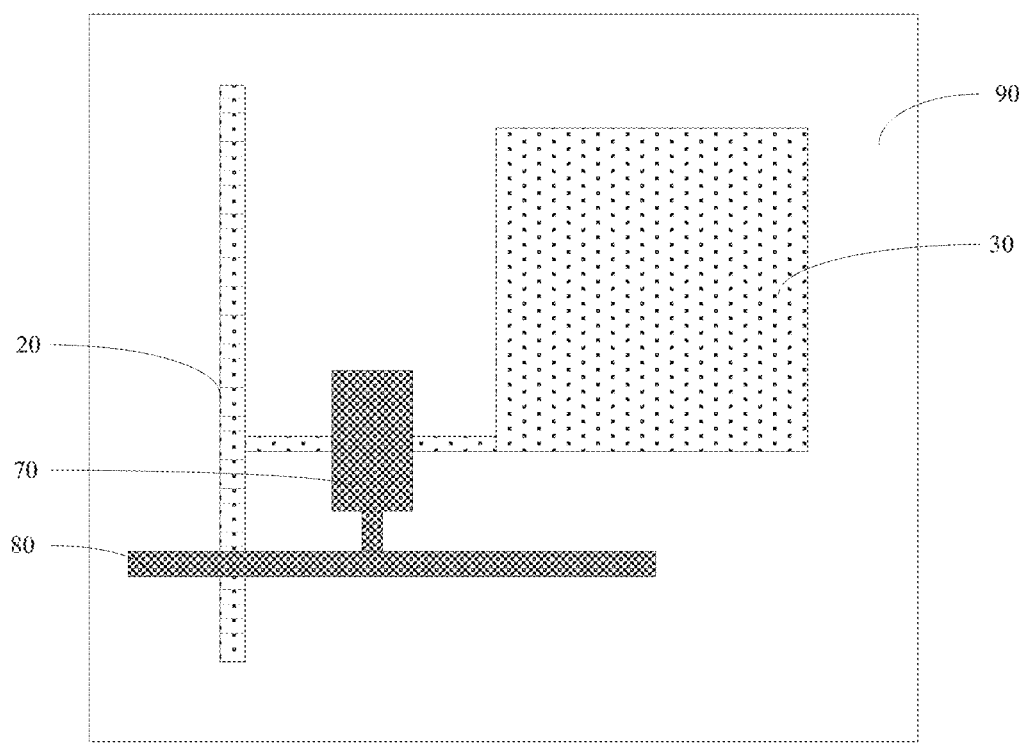
FIG. 13 is a top schematic diagram of the method of manufacturing organic thin film transistor array substrate after finishing step S107 according to an embodiment of the disclosure.

Step S107, please refer to FIG. 12 and FIG. 13, Using a third photo mask for patterning treatment and exposing the pixel electrode 30.

Figure 14:
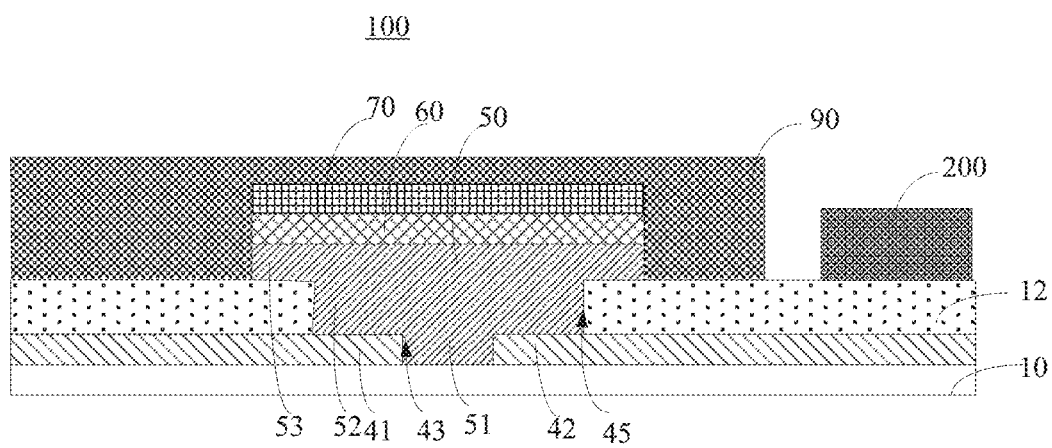
FIG. 14 is a structural schematic diagram of step S10 of the method of manufacturing organic thin film transistor array substrate according to an embodiment of the disclosure.
Figure 15:
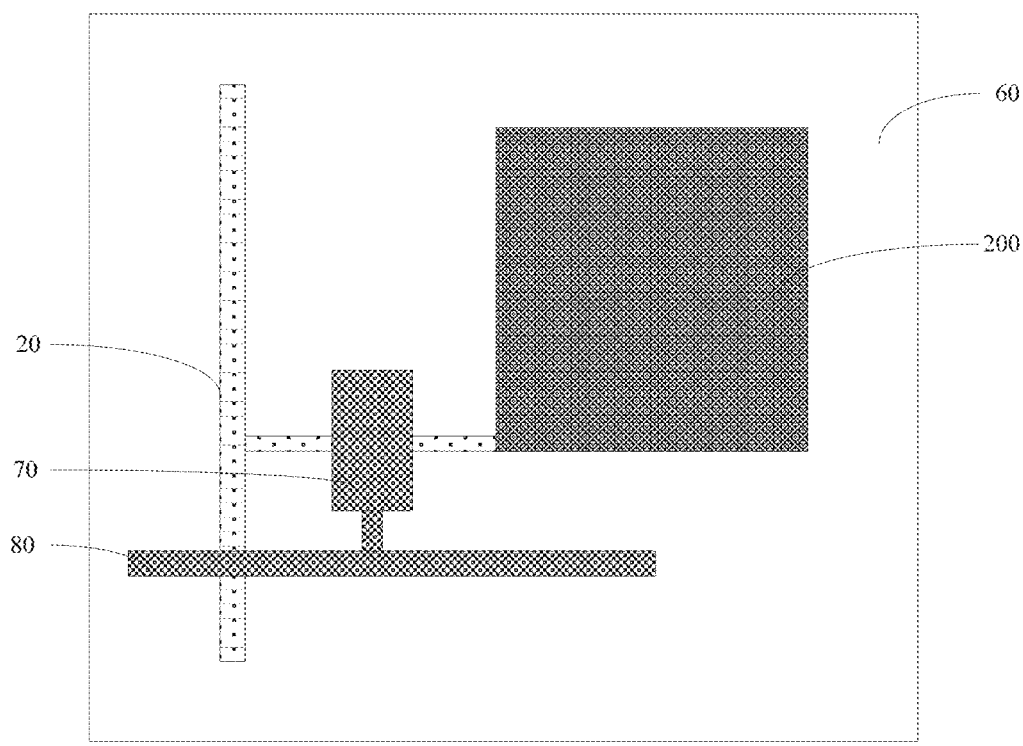
FIG. 15 is a top schematic diagram of the method of manufacturing organic thin film transistor array substrate after finishing step S108 according to an embodiment of the disclosure.

In an embodiment, please refer to FIG. 14 and FIG. 15. Further comprising Step S108: forming an OLED element 110 on the exposing pixel electrode 30, and the pixel electrode 30 as an anode of the OLED element 110.

Wherein, depositing OLED material on the pixel electrode 30 to form an OLED element 110.

In an embodiment, depositing the OLED material is according to evaporation.

Usually, Organic light emitting diode (OLED) display devices can be divided into the bottom emission type, the top emission type and the inverted top emission type according to the light emitting direction and structure. The embodiment of this present invention provides organic thin film transistor array substrate 100 which forming a top emission type OLED thereon because the first metal layer 11 is silver metal layer, opaque in this embodiment.

Comparing the existing technology, the method of manufacturing organic thin film transistor array substrate 100 in this present invention, using a first half transparent photo mask 14 for patterning treatment, and forming a data line 20, a scan line 80, a source 41 and a drain 42. It could effectively reduce mask process steps and reduce cost. After finishing photo mask process, a transparent conducting layer is covered on the first metal layer 11, which effectively avoid oxidation of the first metal layer 11 in the following process and affect transduction property of resistance.

Figure 16:
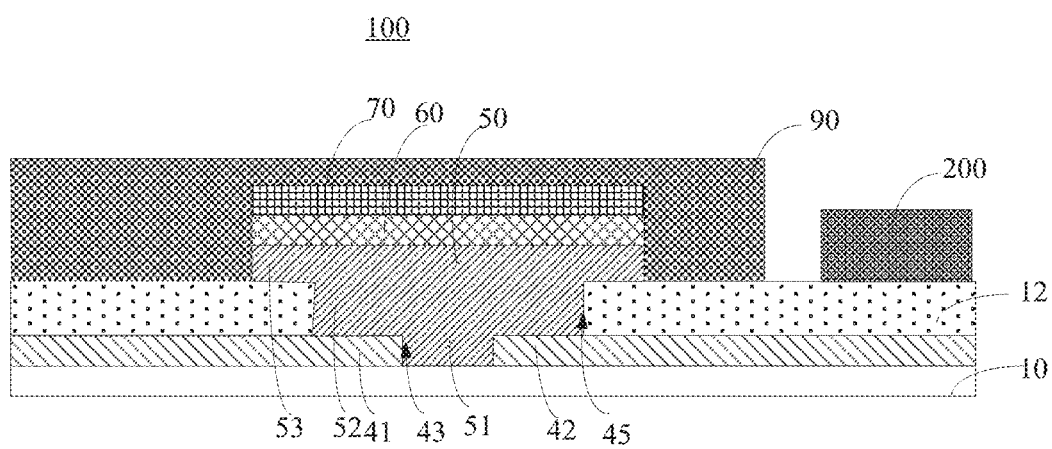
FIG. 16 is a cross-sectional schematic diagram of the method of manufacturing organic thin film transistor array substrate according to an embodiment of the disclosure.
Figure 17:
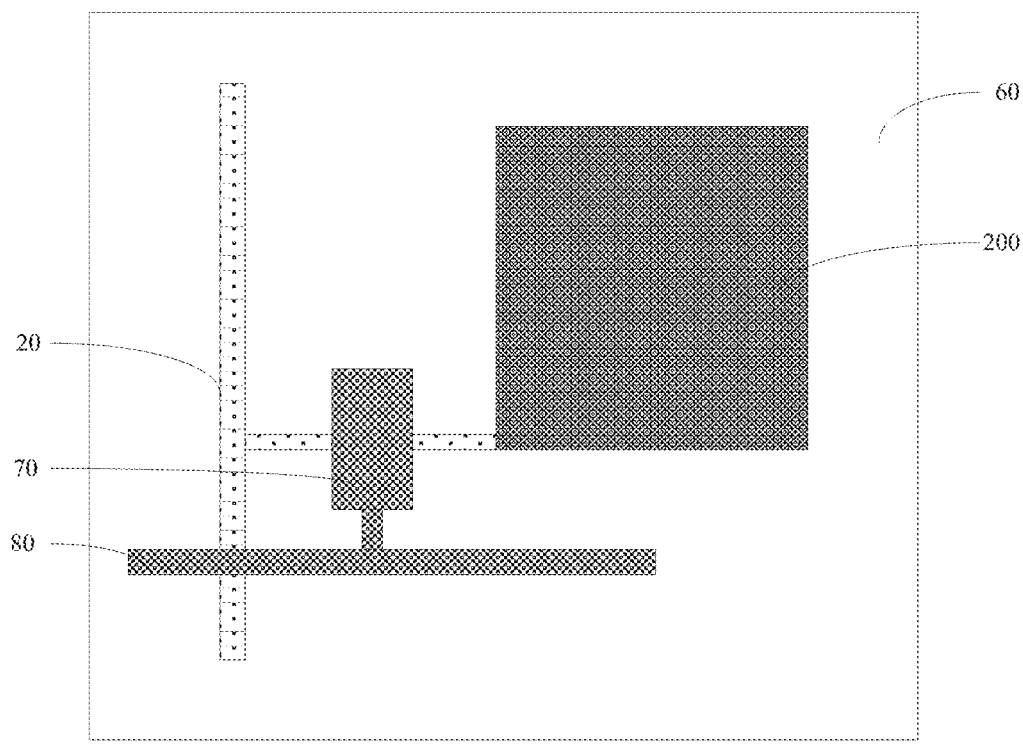
FIG. 17 is top schematic diagram of organic thin film transistor array substrate in the FIG. 16.

Please refer to FIG. 16 and FIG. 17, an organic thin film transistor array substrate is provide in this disclosure. The organic thin film transistor array substrate 100 comprising a substrate 10, a data line 20, a scan line 80, a pixel electrode 30, a source 41, a drain 42, an active layer 50, a grid insulating layer 60, a grid 70 and a passivation layer 90.

Wherein, the data line 20, the pixel electrode 30, the source 41 and the drain 42 are formed by the first metal layer 11 and the transparent electrode layer 12. The first metal layer 11 is silver metal layer, the transparent electrode layer 12 is ITO layer.

In this embodiment, the data line 20 and the pixel electrode 30 are double composite structures comprising silver metal layer and ITO layer, the source 41 and the drain 42 are exposing structures of single layer silver metal layer.

In this embodiment, the source 41, the drain 42, the data line 20 and the pixel electrode 30 are formed in the same photo mask process, and this photo mask process is using half transparent photo mask for patterning treatment. The source 41 is formed by a silver metal layer not covered by the transparent conducting layer and connecting to the silver metal layer of data line 20. The drain 42 is formed by a silver metal layer not covered by the transparent conducting layer and connecting to the silver metal layer of pixel electrode 30.

It could be noted that, a ITO layer is covered on surface of the silver metal layer such that could effectively avoid oxidation of silver metal layer for the following process, and affect transduction property of photoristance. In addition, source 41, drain 42, data line 20 and pixel electrode 30 are formed by the same photo mask process step and in one pattering process. Therefore, it effectively reduce photo mask process steps.

The source 41 and the drain 42 are correspondingly positioned on the substrate 11, the channel region is formed between the source 41 and the drain 42.

The active layer 50, the grid insulating layer 60, the grid 70 are formed on the channel region and extending to form a scan line 80.

The channel region includes a first channel region 43 is positioned between the source 41 and the drain 42, and a second channel region 45 is positioned between the source 41 and the transparent electrode layer 12 positioned above the drain 42. The active layer 50 includes a first active layer 51 filled in the first channel region 43 and a second active layer 52 filled in the second channel region 45, and a third active layer 53 covered on edge of the transparent electrode layer 12.

In this embodiment, the channel region formed the source 50, the grid insulating layer 60, the grid 70 and extending to form the scan line 80, which is the active layer 50 filled into the channel region, and extending to a region which correspondingly positioned scan line 80 on the substrate 10, The grid 70 and the scan line 80 are covering on the active layer 50 and positioned between the active layer 50 and the grid 70, the scan line 80.

In this embodiment, the second metal layer 17 is silver metal layer or copper metal layer.

It could be understand that, deposition of the semiconducting layer 15 and the insulating layer 16 could be dip coating method, spin coating method, blade coating method, contacting coating method, but it is not limited thereto.

In this embodiment, sequentially forming the source 50, the grid insulating layer 60, the grid 70 and the scan line 80 by depositing the semiconducting layer 15, the insulating layer 16 and the second metal layer 17, and patterning treatment by the second photo mask, which could effectively reduce mask numbers and reduce process of mask such that reduce the cost.

It is could be noted that, forming an OLED element 110 on the exposing pixel electrode 30, and the pixel electrode 30 as an anode of the OLED element 110.

Comparing the existing technology, the data line 20, the pixel electrode 30, the source 41 and the drain 42 of the organic thin film transistor array substrate 100 are formed by the first metal layer 11 and the transparent electrode layer 12. In the process of manufacturing, it could effectively reduce photo mask process, reduce cost and surface of the first metal layer 11 is covered the transparent conduction layer. It could effectively avoid oxidation of the first metal layer 11 for the following process, and let the first metal layer 11 has better conducting property.

Figure 18:
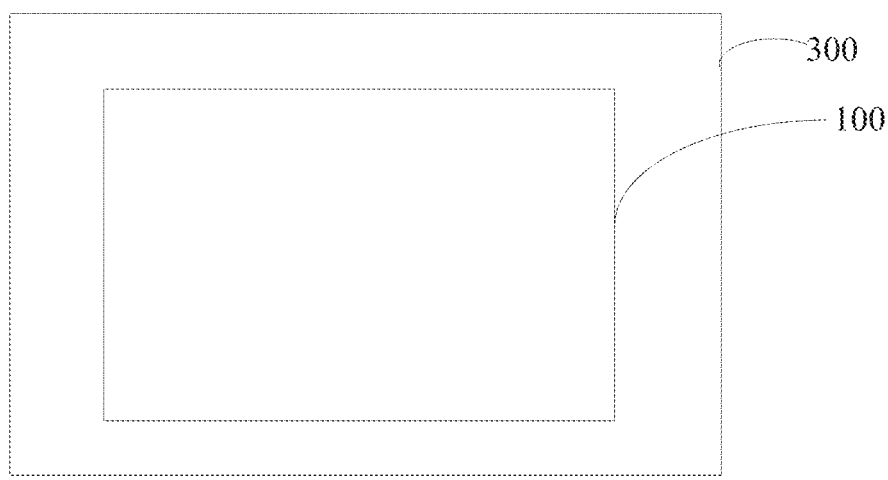
FIG. 18 is a structural schematic diagram of a display device according to an embodiment of the disclosure.

Please refer to FIG. 18, a display device 300 is provided according to embodiment of this disclosure, the display device 300 comprising the organic thin film transistor array substrate 100 described above. Here is not repeat again.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A method of manufacturing organic thin film transistor array substrate, comprising
providing a substrate;
depositing a first metal layer, a transparent electrode layer and a photoresist layer on the substrate by sequentially;
using a first half transparent photo mask for patterning treatment, and forming a data line, a source, a drain and a pixel electrode, wherein a channel region is forming between the source and the drain;
depositing a semiconducting layer, an insulating layer and a second metal layer by sequentially;
using a second photo mask for patterning treatment, and forming an active layer, a grid insulating layer, a grid on the channel region, the grid is connecting to a scan line;
depositing a passivation layer;
using a third photo mask for patterning treatment and exposing the pixel electrode.

2. The method of manufacturing organic thin film transistor array substrate according to claim 1, wherein in the step of using the first half transparent photo mask for patterning treatment, which the first transparent photo mask includes an opacity region, a half transparent region, a transparent region, and the patterning treatment comprising:
using the first half transparent photo mask for development and exposure such that forming a first thickness region, a second thickness region and an empty region of the photoresist layer which are respectively corresponding to the opacity region, the half transparent region and the transparent region;
correspondingly etching the first metal layer and the transparent electrode layer which are positioned under the empty region;
ashing process for synchronous decreasing thicknesses of photoresist for the first thickness region and the second thickness region until removing the photoresist of the second thickness region;
correspondingly etching the transparent electrode layer positioned under the second thickness region for exposing the first metal layer and forming the source and the drain are positioned interval, wherein the channel region includes a first channel region between the source and the drain, and a second channel region between the source and the transparent electrode layer positioned above the drain;
peeling photoresist of the first thickness region.

3. The method of manufacturing organic thin film transistor array substrate according to claim 2, wherein in the step of using the second photo mask for patterning treatment, the second photo mask includes a transparent region and an opacity region, the opacity region is corresponding to the channel region, the active layer includes a first active layer filled in the first channel region and a second active layer filled in the second channel region.

4. The method of manufacturing organic thin film transistor array substrate according to claim 1, wherein the first metal layer is silver metal layer, the transparent electrode layer is ITO layer.

5. The method of manufacturing organic thin film transistor array substrate according to claim 1, wherein further forming an OLED element on the exposing pixel electrode, and the pixel electrode as an anode of the OLED element.

6. An organic thin film transistor array substrate, comprising
a substrate;
a data line, a source, a drain and a pixel electrode formed by a first metal layer and a transparent electrode layer sequentially arranged on the substrate, wherein a channel region is formed between the source and the drain, each of the data line and the pixel electrode is a double-layer structure formed by the first meta layer and the transparent electrode layer, and each of the source and the drain is a single-layer structure formed by the first metal layer only;
an active layer, a grid insulating layer, a grid formed on the channel region and extending to form a scan line;
a passivation layer covering on the substrate and exposing the pixel electrode.

7. The organic thin film transistor array substrate according to claim 6, wherein the channel region includes a first channel region positioned just between the source and the drain, and a second channel region positioned just between the transparent electrode layers respectively above the source and the drain, the active layer includes a first active layer filled in the first channel region and a second active layer filled in the second channel region.

8. The organic thin film transistor array substrate according to claim 6, wherein the active layer further comprises a third active layer, the third active layer is arranged covering on edge of the transparent electrode layer and on a side of the transparent electrode layer facing away from the substrate.

9. The organic thin film transistor array substrate according to claim 6, wherein the first metal layer is silver metal layer, the transparent electrode layer is ITO layer, wherein the data line and the pixel electrode are double compositing structures comprising silver metal layer and ITO layer, the source and the drain are exposing structures of single layer silver metal layer.

10. A display device, comprising an organic thin film transistor array substrate, the organic thin film transistor array substrate comprising
 a substrate;
 a data line, a source, a drain and a pixel electrode formed by a first metal layer and a transparent electrode layer sequentially arranged on the substrate, wherein a channel region is formed between the source and the drain, each of the data line and the pixel electrode is a double-layer structure formed by the first meta layer and the transparent electrode layer, and each of the source and the drain is a single-layer structure formed by the first metal layer only;
 an active layer, a grid insulating layer, a grid formed on the channel region and extending to form a scan line;
 a passivation layer covering on the substrate and exposing the pixel electrode.

11. The display device according to claim 10, wherein the channel region includes a first channel region positioned just between the source and the drain, and a second channel region is positioned just between the transparent electrode layers respectively above the source and the drain, the active layer includes a first active layer filled in the first channel region and a second active layer filled in the second channel region.

12. The display device according to claim 10, wherein the active layer further comprises a third active layer, the third active layer is covering on edge of the transparent electrode layer and on a side of the transparent electrode layer facing away from the substrate.

13. The display device according to claim 10, wherein the first metal layer is silver metal layer, the transparent electrode layer is ITO layer, wherein the data line and the pixel electrode are double compositing structures comprising silver metal layer and ITO layer, the source and the drain are exposing structures of single layer silver metal layer.

* * * * *